(12) United States Patent
Liu et al.

(10) Patent No.: US 9,159,814 B2
(45) Date of Patent: Oct. 13, 2015

(54) MEMORY STRUCTURE AND METHOD FOR FORMING SAME

(71) Applicant: Tsinghua University, Beijing (CN)

(72) Inventors: Libin Liu, Beijing (CN); Jing Wang, Beijing (CN); Renrong Liang, Beijing (CN)

(73) Assignee: Tsinghua University (CN)

( * ) Notice: Subject to any disclaimer, the term of this patent is extended or adjusted under 35 U.S.C. 154(b) by 77 days.

(21) Appl. No.: 13/983,379

(22) PCT Filed: May 31, 2013

(86) PCT No.: PCT/CN2013/076548
§ 371 (c)(1),
(2) Date: Aug. 2, 2013

(87) PCT Pub. No.: WO2014/153834
PCT Pub. Date: Oct. 2, 2014

(65) Prior Publication Data
US 2014/0291752 A1     Oct. 2, 2014

(30) Foreign Application Priority Data
Mar. 26, 2013 (CN) .......................... 2013 1 0100415

(51) Int. Cl.
*H01L 27/115*    (2006.01)
*H01L 29/66*     (2006.01)
*H01L 29/788*    (2006.01)
*H01L 29/792*    (2006.01)

(52) U.S. Cl.
CPC .... *H01L 29/66825* (2013.01); *H01L 27/11556* (2013.01); *H01L 27/11582* (2013.01); *H01L 29/66833* (2013.01); *H01L 29/7889* (2013.01); *H01L 29/7926* (2013.01)

(58) Field of Classification Search
CPC .................. H01L 27/11551; H01L 27/11578; H01L 27/11556; H01L 27/11582
See application file for complete search history.

(56) References Cited

U.S. PATENT DOCUMENTS

| | | | |
|---|---|---|---|
| 2010/0226195 A1* | 9/2010 | Lue ......................... | 365/230.06 |
| 2012/0181580 A1 | 7/2012 | Lue et al. | |
| 2014/0239307 A1* | 8/2014 | Dargis et al. .................... | 257/76 |

FOREIGN PATENT DOCUMENTS

| | | |
|---|---|---|
| CN | 101826545 A | 9/2010 |
| CN | 102386188 A | 3/2012 |
| CN | 102916039 A | 2/2013 |

OTHER PUBLICATIONS

International Search Report and Written Opinion for Application No. PCT/CN2013/076548 dated Jan. 9, 2014.

*Primary Examiner* — Whitney T Moore
(74) *Attorney, Agent, or Firm* — Lerner, David, Littenberg, Krumholz & Mentlik, LLP

(57) ABSTRACT

A memory structure and a method for forming the same are provided. The memory structure comprises: a substrate; a plurality of channel structures formed on the substrate, in which the plurality of channel structures are parallel with each other, each channel structure comprises a plurality of single crystal semiconductor layers and a plurality of oxide layers alternately stacked in a direction perpendicular to the substrate, and at least one of the plurality of oxide layers is a single crystal oxide layer; and a plurality of gate structures matched with the plurality of channel structures, in which each gate structure comprises a gate dielectric layer immediately adjacent to the plurality of channel structures and a gate electrode layer immediately adjacent to the gate dielectric layer.

18 Claims, 8 Drawing Sheets

MEMORY STRUCTURE AND METHOD FOR FORMING SAME

CROSS-REFERENCE TO RELATED APPLICATION

The present application is a national phase entry under 35 U.S.C. §371 of International Application No. PCT/CN2013/076548 filed on May 31, 2013, which claims priority from Chinese Patent Application No. 201310100415.1, filed on Mar. 26, 2013, all of which is incorporated herein by reference.

FIELD

The present disclosure relates to a semiconductor field, and more particularly to a memory structure and a method for forming the same.

BACKGROUND

A NAND flash memory as a memory structure has an increasingly wide commercial applications, such as a smart phone, a tablet PC and a solid state disk. To fulfill requirements of these applications, the NAND flash memory is required to have low cost and high storage density. However, a conventional planar NAND flash memory is difficult to be scaled down below 20 nm because of many factors such as a limit of photolithography, short channel effects, less stored electrons and a floating gate coupling. Therefore, a three-dimensional NAND (3D-NAND) flash memory has gradually become an attention focus.

A current 3D-NAND flash memory array is classified into a gate stacked type and a channel stacked type. The gate stacked type 3D-NAND flash memory comprises a P-BiCS (Pipe-shaped Bit Cost Scalable) structure and a TCAT (Terabit Cell Array Transistor) structure. The channel stacked type 3D-NAND flash memory comprises a VG NAND (Vertical-Gate NAND) structure and a STAR (Single-Crystalline Si Stacked Array) structure.

For the gate stacked type 3D-NAND flash memory, a bit line is perpendicular to a surface of a chip, and gates are parallel with the surface of the chip and stacked in a vertical direction. With an increase of a number of stacked gate layers, a stacking of the gates is getting more and more difficult, and thus a number of the bit lines is greatly limited so that it is difficult to fulfill a 64-bit length which is predicted in ITRS (International Technology Roadmap for Semiconductors). For the channel stacked type 3D-NAND flash memory, the bit line is parallel with the surface of the chip so that a length of the bit lines is not limited. In addition, compared with the channel stacked type 3D-NAND flash memory, the gate stacked type 3D-NAND flash memory, which has disadvantages of a large unit area and a low integration level, is not applicable for a large scale memory array. Therefore, the channel stacked type 3D-NAND flash memory is more applicable for a future large scale 3D-NAND flash memory.

For a current channel stacked type 3D-NAND flash memory, only a unit in the STAR structure may use single crystal Si as a material of the channel, while a unit in the VG NAND structure may only use poly-Si as the material of the channel. For the VG NAND structure, a crystal defect and a grain interface result in a large fluctuation of a threshold voltage, a large performance difference between different memory units, a poor subthreshold characteristic and a large off-state leakage current, and thus it is difficult to obtain a uniform and stable memory unit like the unit in the STAR structure. However, because the unit in the VG NAND structure is smaller than that in the STAR structure, the VG NAND structure has advantages of a higher integration level, a simpler fabrication process, and a better process reliability. If a single crystal semiconductor is used as the material of the channel of the VG NAND structure, disadvantages of the VG NAND structure will be overcome, so that not only will the fabrication process be simplified, but also the VG NAND structure will have higher integration level so as to fulfill requirements of the future large scale 3D-NAND flash memory array.

A critical step of a method for forming the VG NAND structure with a single crystal channel lies in how to form an alternate structure of a plurality of insulating layers and a plurality of single crystal semiconductor layers. In the prior art, the alternate structure is formed by using a SiGe layer as a sacrifice layer. Specifically, an alternate structure of a plurality of SiGe layers and a plurality of single crystal Si layers is formed, then the plurality of SiGe layers are selectively etched, and then a poly crystal insulating dielectric is filled between the plurality of single crystal Si layers. This method has disadvantages of complicated steps (for example, using the SiGe layer as the sacrifice layer), high difficulty (for example, forming a floated semiconductor structure) and low yield. Moreover, overmany etchings result in an increase in crystal lattice defects in the channel and/or at interfaces, thus deteriorating a performance of a device.

SUMMARY

The present disclosure is aimed to solve at least one of the problems.

According to one aspect of the present disclosure, a memory structure is provided. The memory structure comprises: a substrate; a plurality of channel structures formed on the substrate, in which the plurality of channel structures are parallel with each other, each channel structure comprises a plurality of single crystal semiconductor layers and a plurality of oxide layers alternately stacked in a direction perpendicular to the substrate, and at least one of the plurality of oxide layers is a single crystal oxide layer; and a plurality of gate structures matched with the plurality of channel structures, in which each gate structure comprises a gate dielectric layer immediately adjacent to the plurality of channel structures and a gate electrode layer immediately adjacent to the gate dielectric layer.

In one embodiment, a material of the single crystal oxide layer comprises any one of BeO, a rare earth oxide and a combination thereof.

In one embodiment, the rare earth oxide comprises any one of $(Gd_{1-x}Er_x)_2O_3$, $(Gd_{1-x}Nd_x)_2O_3$, $(Er_{1-x}Nd_x)_2O_3$, $(Pr_{1-x}La_x)_2O_3$, $(Pr_{1-x}Nd_x)_2O_3$, $(Pr_{1-x}Gd_x)_2O_3$, $(Er_{1-x}La_x)_2O_3$ and a combination thereof, where x is within a range from 0 to 1.

In one embodiment, the plurality of gate structures are perpendicular to the plurality of channel structures, each channel structure penetrates the plurality of channel structures, and each gate structure covers the plurality of channel structures.

In one embodiment, the storage further comprises a first isolation structure formed between adjacent gate structures.

In one embodiment, the storage further comprises a semiconductor structure formed at both ends of the plurality of channel structures.

In one embodiment, the storage further comprises a second isolation structure formed between the gate structure and the semiconductor structure.

In one embodiment, the storage further comprises a poly-Si layer formed on the plurality of channel structures.

In one embodiment, each single crystal semiconductor layer is an extrinsic semiconductor layer.

In one embodiment, each gate dielectric layer comprises a tunneling oxide layer, a charge trapping layer and a block oxide layer stacked sequentially.

In one embodiment, a material of the charge trapping layer comprises any one of a nitride, a nano crystal, a poly-Si and a combination thereof.

In one embodiment, a material of each single crystal semiconductor layer comprises any one of Si, Ge, SiGe, group III-V compound semiconductor materials, group II-VI compound semiconductor materials and a combination thereof.

In one embodiment, a thickness of the single crystal oxide layer is not less than 25 nm.

In one embodiment, a material of the substrate comprises single crystal Si, single crystal SiGe and single crystal Ge.

In one embodiment, the single crystal oxide layer comprises one or more single crystal oxide sub-layers.

In one embodiment, each single crystal semiconductor layer comprises one or more single crystal semiconductor sub-layers.

According to another aspect of the present disclosure, a method for forming a memory structure is provided. The method comprises: providing a substrate; forming a plurality of single crystal semiconductor layers and a plurality of oxide layers alternately stacked on the substrate in a direction perpendicular to the substrate, in which at least one of the plurality of oxide layers is a single crystal oxide layer; etching the plurality of single crystal semiconductor layers and the plurality of oxide layers to form a plurality of channel structures parallel with each other; and forming a plurality of gate structures matched with the plurality of channel structures on the substrate, in which each gate structure comprises a gate dielectric layer immediately adjacent to the plurality of channel structures and a gate electrode layer immediately adjacent to the gate dielectric layer.

In one embodiment, the method further comprises: after forming the plurality of gate structures matched with the plurality of channel structures on the substrate, forming a first isolation structure between adjacent gate structures and on the plurality of channel structures; or before forming the plurality of gate structures matched with the plurality of channel structures on the substrate, forming an isolation layer covering the plurality of channel structures on the substrate, and etching the isolation layer to form a plurality of gate windows, where the plurality of gate structures are to be formed.

In one embodiment, a material of the single crystal oxide layer comprises any one of BeO, a rare earth oxide and a combination thereof.

In one embodiment, the rare earth oxide comprises any one of $(Gd_{1-x}Er_x)_2O_3$, $(Gd_{1-x}Nd_x)_2O_3$, $(Er_{1-x}Nd_x)_2O_3$, $(Pr_{1-x}La_x)_2O_3$, $(Pr_{1-x}Nd_x)_2O_3$, $(Pr_{1-x}Gd_x)_2O_3$, $(Er_{1-x}La_x)_2O_3$ and a combination thereof, where x is within a range from 0 to 1.

In one embodiment, the plurality of gate structures are perpendicular to the plurality of channel structures, each channel structure penetrates the plurality of channel structures, and each gate structure covers the plurality of channel structures.

In one embodiment, the method further comprises: etching the plurality of single crystal semiconductor layers and the plurality of oxide layers to simultaneously form the plurality of channel structures and a semiconductor structure formed at both ends of the plurality of channel structures.

In one embodiment, the method further comprises: forming a poly-Si layer on the plurality of channel structures.

In one embodiment, each single crystal semiconductor layer is an extrinsic semiconductor layer.

In one embodiment, each gate dielectric layer comprises a tunneling oxide layer, a charge trapping layer and a block oxide layer stacked sequentially.

In one embodiment, a material of the charge trapping layer comprises any one of a nitride, a nano crystal, a poly-Si and a combination thereof.

In one embodiment, a material of each single crystal semiconductor layer comprises any one of Si, Ge, SiGe, group III-V compound semiconductor materials, group II-VI compound semiconductor materials and a combination thereof.

In one embodiment, a thickness of the single crystal oxide layer is not less than 25 nm.

In one embodiment, a material of the substrate comprises single crystal Si, single crystal SiGe and single crystal Ge.

In one embodiment, the single crystal oxide layer comprises one or more single crystal oxide sub-layers.

In one embodiment, each single crystal semiconductor layer comprises one or more single crystal semiconductor sub-layers.

The memory structure and the method for forming the same according to embodiments of the present disclosure at least have following advantages.

(1) The process is simplified, and the yield is improved. The single crystal rare earth oxide or the single crystal beryllium oxide is used as an interlayer dielectric. Because among rare earth elements, most actinide elements are radioactive and hence are rarely applied, a lanthanide oxide is mostly used as the rare earth oxide. Both crystals of the rare earth oxide and a conventional semiconductor material such as Si, Ge, SiGe or GaAs belong to a cubic crystal system, and lattice constants of rare earth oxide crystals such as $La_2O_3$, $Pr_2O_3$, $Nd_2O_3$, $Er_2O_3$ or $Gd_2O_3$ of different lanthanide elements are approximately the same, which are about twice that of a Si or Ge crystal, that is, one unit cell of the rare earth oxide crystal is just matched with two unit cells of the Si or Ge crystal. Thus, lattice constants of the rare earth oxide crystal and the Si or Ge crystal are substantially matched with each other, which helps to form the single crystal semiconductor layer on the rare earth oxide layer and to form the rare earth oxide layer on the single crystal semiconductor layer. Similarly, both crystals of beryllium oxide and a conventional semiconductor material such as Si, Ge, SiGe or GaAs belong to a cubic crystal system, and a lattice constant of the beryllium oxide crystal is about half that of the Si crystal, that is, one unit cell of the Si crystal is just matched with two unit cells of the beryllium oxide crystal. Thus, the lattice constants of the Si crystal and the beryllium oxide crystal are substantially matched with each other, which may help to form the single crystal semiconductor layer on the single crystal beryllium oxide layer and to form the single crystal beryllium oxide layer on the single crystal semiconductor layer. Therefore, by using the lattice match between the rare earth oxide crystal or the beryllium oxide crystal and the conventional semiconductor crystal, the plurality of single crystal semiconductor layers and the plurality of oxide layers may be alternately formed by a simple process, such as an epitaxial growth, thus ensuring that the plurality of single crystal semiconductor layers are well isolated from each other. Moreover, a sacrifice layer is not required by the method, thus simplifying the process and improving the yield. Furthermore, a high-quality stack of the plurality of single crystal semiconductor layers and the plurality of oxide layers may be formed by simple alternate epitaxial growth, thus ensuring a growth quality and an amount of stacked layers.

(2) A lattice quality of the single crystal semiconductor layers is high, and a performance of a memory unit is improved. In one aspect, by adjusting the element type and content of the single crystal oxide layer, especially the element type and content of the rare earth oxide, the lattice constant thereof is adjusted accordingly. For instance, the lattice constant of $La_2O_3$ is slightly more than twice that of Ge, the lattice constants of $Er_2O_3$ and $Gd_2O_3$ are slightly smaller than twice that of Si, and the lattice constants of $Pr_2O_3$ and $Nd_2O_3$ are between twice those of Si and Ge. By adjusting the content of the element such as La or Er of the rare earth oxide, the lattice constant thereof may be matched with that of a semiconductor crystal such as Si, Ge, SiGe or GaAs so as to reduce a crystal defect and form the single crystal semiconductor layers with high quality, thus enabling a device formed subsequently with a high mobility and the memory unit with a better performance. In another aspect, since a single crystal SiGe sacrifice layer is not required, damages to the lattice of the single crystal semiconductor layers by the etching, refilling and floating are avoided, which not only reduces a performance degradation caused by the process to a largest extent, but also improves a reliability of the device. In addition, the memory unit in the VG NAND structure with a single crystal channel has advantages of good drive capability, smaller unit size, uniform threshold voltage and low off-state leakage current.

(3) An integration level of the memory unit is high. Provided that a time delay of the memory structure and a process level are fulfilled, the three-dimensional memory structure may be constructed with any number of stacked layers and with any number of arrays. Furthermore, with a reducing of the process difficulty, the number of the stacked layers and the number of the arrays will be increased, thus further increasing the integration level.

(4) A read-write speed is raised. The performance of the memory structure is improved because of high mobility of the memory unit, powerful drive capability, simple and reliable fabrication process, small process fluctuation, stable device parameter and flexible arrangement of bit lines and word lines.

(5) The heat conductivities of the single crystal rare earth oxide and the single crystal beryllium oxide are larger than that of a conventional oxide such as silicon dioxide or silicon oxynitride. For instance, the heat conductivity of the single crystal rare earth oxide is three times larger than that of the thermal growth $SiO_2$ dielectric, and the heat conductivity of the single crystal beryllium oxide is approximately equal to that of aluminium, thus improving the heat dissipation of devices significantly and enhancing a device performance accordingly.

(6) A conventional epitaxy process such as MOCVD (metal-organic chemical vapor deposition), SSE (solid source epitaxy), UHVCVD (ultra-high vacuum chemical vapor deposition) or MBE (molecular beam epitaxy) may be introduced to fabricate the channel structure. These fabrication processes are compatible with conventional semiconductor fabrication processes, simple to realize and low in cost.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which:

FIG. 1b is a top view of the memory structure shown in FIG. 1a;

FIG. 2b is a top view of the memory structure shown in FIG. 2a;

FIG. 12b is a schematic perspective view of the 3D-NAND memory array shown in FIG. 12a; and FIG. 12c is a schematic view showing a doping state of a GSL (Ground-Select Line) of the 3D-NAND memory array shown in FIG. 12a.

DETAILED DESCRIPTION

Figure 1A:
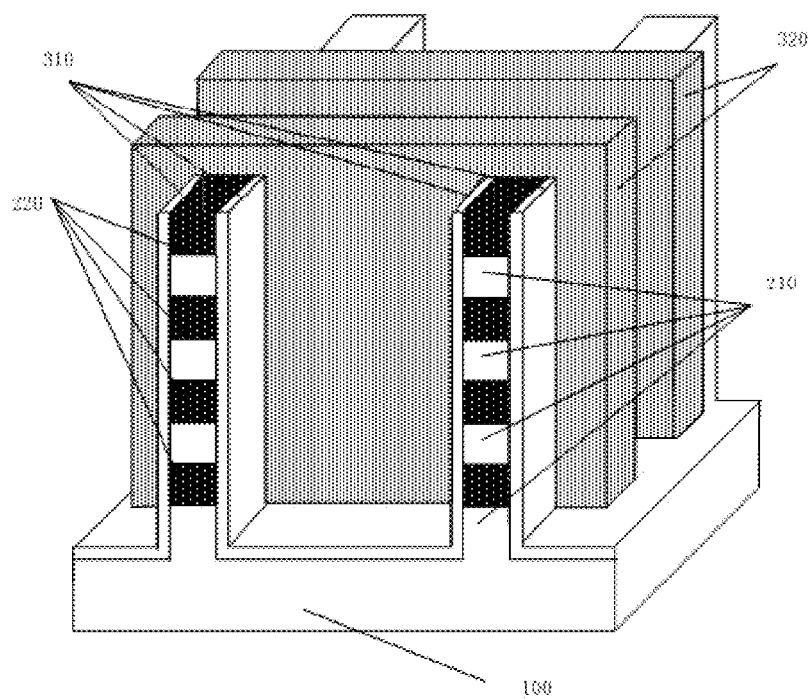
FIG. 1a is a schematic perspective view of a memory structure according to a first embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

It is to be understood that phraseology and terminology used herein with reference to device or element orientation (such as, terms like "longitudinal", "lateral", "front", "rear", "right", "left", "lower", "upper", "horizontal", "vertical", "above", "below", "up", "top", "bottom" as well as derivative thereof such as "horizontally", "downwardly", "upwardly", etc.) are only used to simplify description of the present invention, and do not alone indicate or imply that the device or element referred to must have or operated in a particular orientation, and thus do not be construed to limit the present disclosure. In addition, terms such as "first" and "second" are used herein for purposes of description and are not intended to indicate or imply relative importance or significance. Furthermore, except as otherwise indicated, "a plurality of" means two or more.

Figure 1B:
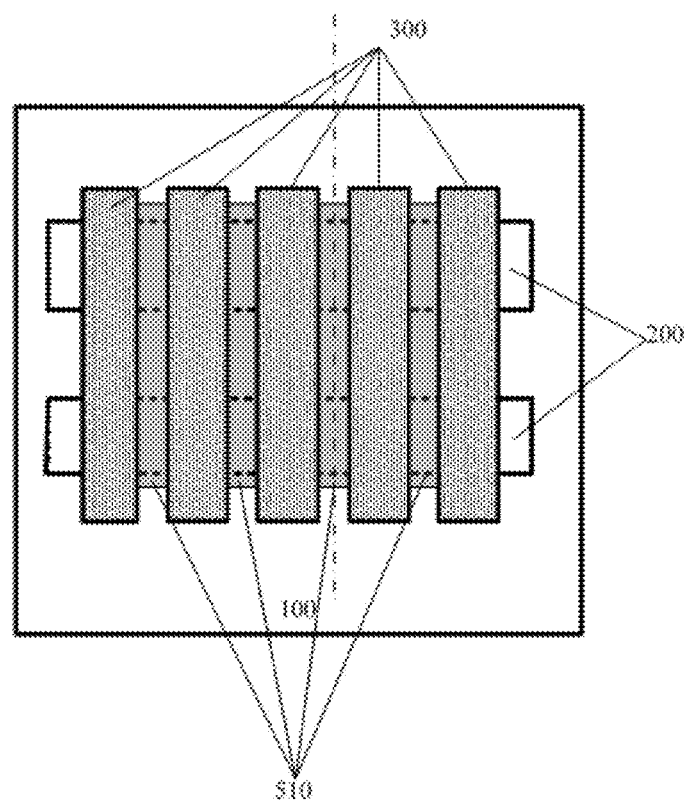

FIG. 1a is a schematic perspective view of a memory structure with a section according to a first embodiment of the present disclosure. FIG. 1b is a top view of the memory structure shown in FIG. 1a, in which a dashed line in FIG. 1b represents a projection of the section in FIG. 1a.

As shown in FIG. 1a and FIG. 1b, the memory structure comprises: a substrate 100, a plurality of channel structures 200 formed on the substrate 100, a plurality of gate structures 300 formed on the substrate 100, and a first isolation structure 510 formed between adjacent gate structures 300.

The plurality of channel structures 200 are parallel with each other. Each channel structure 200 comprises a plurality of single crystal semiconductor layers 210 and a plurality of oxide layers 220 alternately stacked in a direction perpendicular to the substrate 100. At least one of the plurality of oxide layers 220 is a single crystal oxide layer. The plurality of gate structures 300 extend along a second direction and are arranged at intervals in a first direction perpendicular to the second direction. Each channel structure 200 penetrates the plurality of gate structures 300, and each gate structure 300 covers the plurality of channel structures 200. Each gate structure 300 comprises a gate dielectric layer 310 immediately adjacent to the plurality of channel structures 200 and a gate electrode layer 320 immediately adjacent to the gate dielectric layer 310. The first isolation structure 510 is used for electrically isolating the plurality of gate structures 300.

Figure 2A:
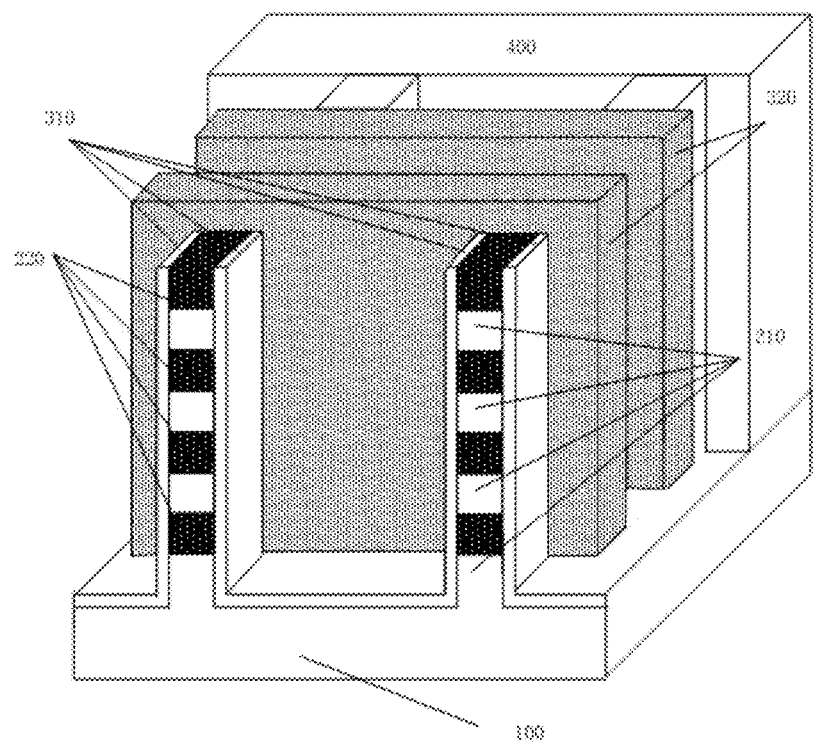
FIG. 2a is a schematic perspective view of a memory structure according to a second embodiment of the present disclosure.
Figure 2B:
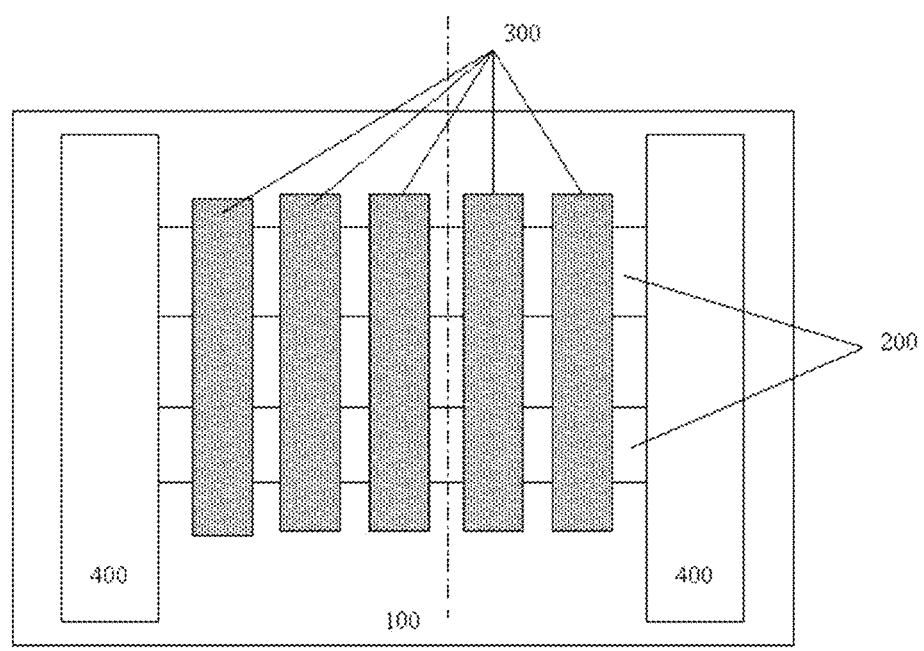

FIG. 2a is a schematic perspective view of a memory structure with a section according to a second embodiment of the present disclosure. FIG. 2b is a top view of the memory structure shown in FIG. 2a, in which a dashed line in FIG. 2b represents a projection of the section in FIG. 2a.

As shown in FIG. 2a and FIG. 2b, the memory structure comprises: a substrate 100, a plurality of channel structures 200 formed on the substrate 100, a plurality of gate structures 300 formed on the substrate 100, two semiconductor structures 400 formed on the substrate 100 and at both ends of the plurality of channel structures 200, and an isolation layer 500 filled in the residual space of the memory structure. The isolation layer 500 which is an integral layer comprises: a first isolation structure 510 for isolating the plurality of gate structures 300, and a second isolation structure (not shown) for isolating the gate structure 300 and the semiconductor structure 400.

It can be seen that differences between the first embodiment and the second embodiment lie in the semiconductor structures 400 and the second isolation structure, which are only included in the memory structure according to the second embodiment of the present disclosure. Other parts (such as the plurality of channel structures 200 and the plurality of gate structures 300) of the memory structure, which are identical for the two embodiments, will not be described in detail here.

Each semiconductor structure 400 extends along the second direction. Similar to the channel structure 200, each semiconductor structure 400 comprises a plurality of single crystal semiconductor layers 210 and a plurality of oxide layers 220 alternately stacked in the direction perpendicular to the substrate 100. The semiconductor structures 400 are generally fabricated as a control element of an array or an electrical lead-out structure of various connecting lines such as SSL (String Select Line) and CSL (Common Source Line).

For the memory structures according to the first embodiment and the second embodiment of the present disclosure, the substrate 100, the channel structures 200 and the gate structures 300 will be described in detail as follows.

In one embodiment, a material of the substrate 100 may comprise single crystal Si, single crystal SiGe and single crystal Ge.

In one embodiment, a material of each single crystal semiconductor layer 210 may comprise any one of Si, Ge, SiGe, group III-V compound semiconductor materials, group II-VI compound semiconductor materials and a combination thereof.

In one embodiment, each single crystal semiconductor layer 210 is an extrinsic semiconductor layer, which may be formed by doping during forming each single crystal semiconductor layer 210, or by ion implantation after forming an alternate stack of the plurality of single crystal semiconductor layers 210 and the plurality of oxide layers 220. The extrinsic single crystal semiconductor layer 210 has a relatively lower resistivity, thus reducing a source drain series resistance, adjusting a doping in the channel structure, and accordingly adjusting a threshold voltage of the channel structure.

In one embodiment, a material of the single crystal oxide layer comprises any one of BeO, a rare earth oxide and a combination thereof. Specifically, the rare earth oxide may comprise $(Gd_{1-x}Er_x)_2O_3$, $(Gd_{1-x}Nd_x)_2O_3$, $(Er_{1-x}Nd_x)_2O_3$, $(Pr_{1-x}La_x)_2O_3$, $(Pr_{1-x}Nd_x)_2O_3$, $(Pr_{1-x}Gd_x)_2O_3$ and $(Er_{1-x}La_x)_2O_3$, where x is within a range from 0 to 1.

In one preferred embodiment, a stack of the plurality of single crystal semiconductor layers and the plurality of oxide layers may be formed by simple alternate epitaxial growth, thus ensuring a growth quality and an amount of stacked layers.

In one embodiment, a thickness of the single crystal oxide layer is not less than 25 nm. Preferably, the thickness of the single crystal oxide layer ranges from 50 nm to 200 nm, because an over thin single crystal oxide layer may result in an over large capacitance.

In one embodiment, the single crystal oxide layer 220 comprises one or more single crystal oxide sub-layers.

In one embodiment, each single crystal semiconductor layer 210 comprises one or more single crystal semiconductor sub-layers.

In one embodiment, each gate dielectric layer 310 comprises a tunneling oxide layer, a charge trapping layer and a block oxide layer stacked sequentially. Specifically, the tunneling oxide layer is immediately adjacent to the channel structure, and a thickness of the tunneling oxide layer usually reaches a nanometer order of magnitude. Electrons excited by a certain voltage are allowed to go through the tunneling oxide layer and enter into the charge trapping layer to be trapped. Similarly, when excited by a certain voltage, electrons trapped by the charge trapping layer also may go through the tunneling oxide layer to be released. Therefore, the tunneling oxide layer is not only used for the purpose of insulation, but also used as a tunnel connected the charge trapping layer and the channel structure for exchanging charges. The charge trapping layer is usually made of a material with more defects and dislocations, by which the charges are trapped and thus difficult to lose in a short time. In this way, the charge trapping layer has a function of memory. The block oxide layer, which is formed between the charge trapping layer and the gate electrode layer 320, is used for blocking a charge passage between the charge trapping layer and the gate electrode layer 320. In one embodiment, a material of the charge trapping layer comprises any one of a nitride, a nano crystal, a poly-Si and a combination thereof. The three materials are generally poly crystal or amorphous, and thus have a higher interface state density and a larger defect density. Unsaturated bonds resulted from these interface states and defects may trap charges and retain the charges for a long time without exterior excitation. Moreover, the charges are trapped by spatially separated defects, which enables the memory structure to have a high anti-radiation capability.

In one embodiment, a poly-Si layer 600 is formed on the plurality of channel structures 200. The poly-Si layer 600 is used as a hard mask to improve an etching quality, thus forming the refined gate structure.

Figure 3:
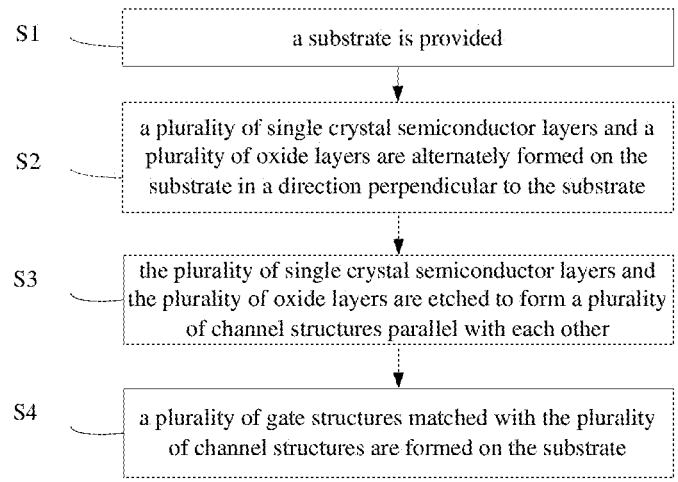
FIG. 3 is a flowchart of a method for forming a memory structure according to an embodiment of the present disclosure.

FIG. 3 is a flowchart of a method for forming the memory structure according to an embodiment of the present disclosure. As shown in FIG. 3, the method comprises following steps.

In step S1, a substrate is provided.

In step S2, a plurality of single crystal semiconductor layers and a plurality of oxide layers are alternately formed on the substrate in a direction perpendicular to the substrate, in which at least one of the plurality of oxide layers is a single crystal oxide layer.

In step S3, the plurality of single crystal semiconductor layers and the plurality of oxide layers are etched to form a plurality of channel structures parallel with each other.

In step S4, a plurality of gate structures matched with the plurality of channel structures are formed on the substrate, in which each gate structure comprises a gate dielectric layer immediately adjacent to the plurality of channel structures and a gate electrode layer immediately adjacent to the gate dielectric layer.

In one embodiment, after step S4, an isolation layer is deposited on the substrate to fill in the residual space of the memory structure, The isolation layer which is an integral layer comprises: a first isolation structure for isolating the plurality of gate structures, and a second isolation structure for isolating the gate structure and the semiconductor structure for isolating the plurality of channel structures. Specifically, the first isolation structure is formed between adjacent gate structures and on the plurality of channel structures. In another embodiment, between step S3 and step S4, an isolation layer covering the plurality of channel structures is formed on the substrate, and then the isolation layer is etched to form a plurality of gate windows, where the plurality of gate structures will be formed.

In order to make those skilled in the art better understand the present disclosure, detailed steps of the method for fabricating the memory structure are described below with reference to FIGS. 4-11b. The memory structure according to the second embodiment of the present disclosure will be formed by this method.

In step 01, a substrate 100 is provided. In one embodiment, a material of the substrate 100 may comprise single crystal Si, single crystal SiGe and single crystal Ge.

Figure 4:
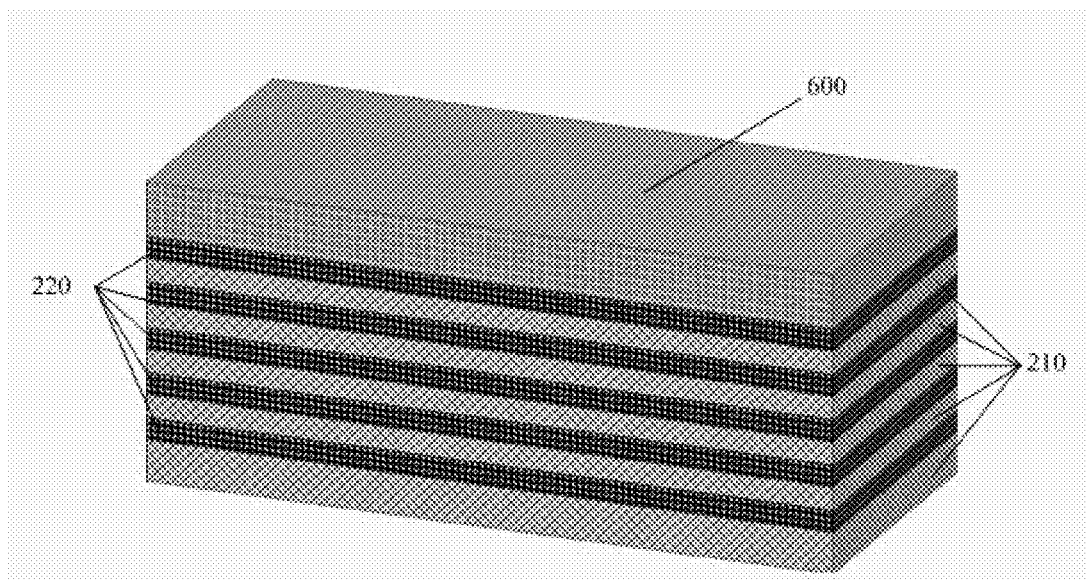
FIGS. 4-10 are schematic perspective views of intermediate statuses of a memory structure formed in steps of a method for fabricating the memory structure according to an embodiment of the present disclosure.

In step 02, a plurality of single crystal semiconductor layers 210 and a plurality of oxide layers 220 are alternately formed on the substrate 100 in a direction perpendicular to the substrate 100, as shown in FIG. 4. In one embodiment, a material of each single crystal semiconductor layer 210 may comprise any one of Si, Ge, SiGe, group III-V compound semiconductor materials, group II-VI compound semiconductor materials and a combination thereof. At least one of the plurality of oxide layers 220 is a single crystal oxide layer. A material of the single crystal oxide layer comprises any one of BeO, a rare earth oxide and a combination thereof. Specifically, the rare earth oxide may comprise $(Gd_{1-x}Er_x)_2O_3$, $(Gd_{1-x}Nd_x)_2O_3$, $(Er_{1-x}Nd_x)_2O_3$, $(Pr_{1-x}La_x)_2O_3$, $(Pr_{1-x}Nd_x)_2O_3$, $(Pr_{1-x}Gd_x)_2O_3$ and $(Er_{1-x}La_x)_2O_3$, where x is within a range from 0 to 1. A thickness of the single crystal oxide layer is not less than 25 nm. Preferably, the thickness of the single crystal oxide layer ranges from 50 nm to 200 nm, because an over thin single crystal oxide layer may result in an over large capacitance. It should be noted that, each single crystal semiconductor layer 210 may comprise one or more single crystal semiconductor sub-layers such as sub-layers of Si/SiGe/Ge, and the single crystal oxide layer may comprise one or more single crystal oxide sub-layers such as a plurality of $(Gd_{1-x}Er_x)_2O_3$ sub-layers with different Gd contents and different Er contents. Such structure may suppress an extension of a dislocation in the oxide layers, thus reducing a dislocation density.

In one preferred embodiment, a stack of the plurality of single crystal semiconductor layers and the plurality of oxide layers may be formed by simple alternate epitaxial growth, thus ensuring a growth quality and an amount of stacked layers.

In one embodiment, each single crystal semiconductor layer 210 is doped to form an extrinsic semiconductor layer. The extrinsic single crystal semiconductor layers 210 may be formed by doping during forming each single crystal semiconductor layer 210, or by deep ion implantation after forming an alternate stack of the plurality of single crystal semiconductor layers 210 and the plurality of oxide layers 220. In addition, a GSL may be simultaneously doped by tilt angle implantation. By forming the extrinsic single crystal semiconductor layer 210, a resistivity thereof may be lowered, thus reducing a source drain series resistance, adjusting a doping in the channel structure, and accordingly adjusting a threshold voltage of the channel structure.

In one embodiment, a poly-Si layer 600 is formed on the plurality of channel structures 200. The poly-Si layer 600 is used as a hard mask to improve an etching quality, thus forming the refined gate structure.

Figure 5:
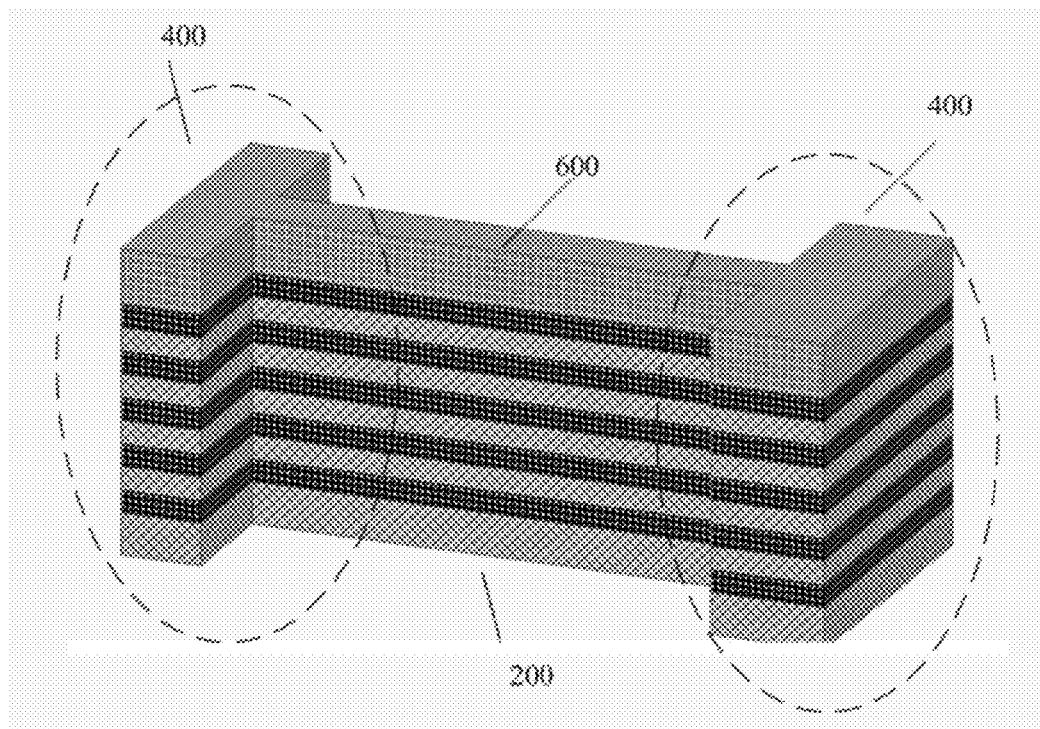

In step 03, the plurality of single crystal semiconductor layers 210 and the plurality of single crystal oxide layers 220 are etched to form a plurality of channel structures 200 and two semiconductor structures 400, in which the plurality of channel structures 20 are parallel with each other and extend along a first direction, and the two semiconductor structures 400 are located at both ends of the plurality of channel structures 200 and extend along a second direction, as shown in FIG. 5. In this embodiment, the first direction is perpendicular to the second direction. The semiconductor structures 400 are generally fabricated as a control element of an array or a lead-out structure of various connecting lines such as SSL and CSL. It should be noted that, for the purpose of conciseness, only one channel structure 200 is shown in FIG. 5.

Figure 6:
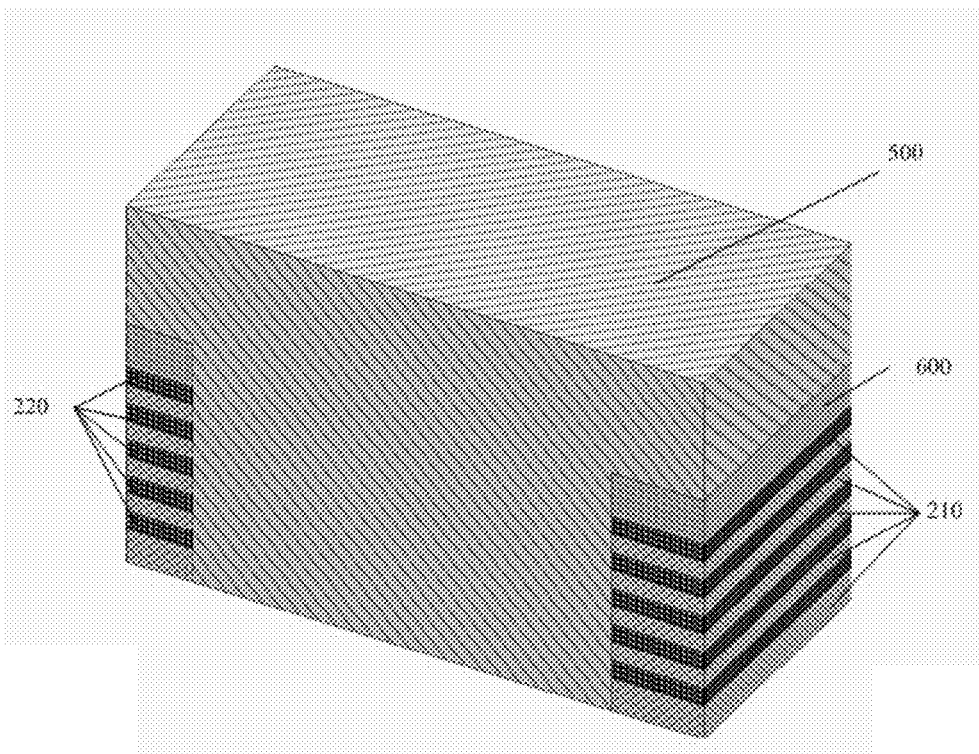

In step 04, an isolation layer 500 is deposited on the substrate 100 to fill in the residual space of the memory structure, that is, the isolation layer 500 covers the substrate 100, the two semiconductor structures 400 and the plurality of channel structures 200, as shown in FIG. 6.

In step 05, the isolation layer 500 is etched to form a plurality of gate windows, a gate dielectric material and a gate electrode material are deposited into the plurality of gate windows sequentially and then etched to form the plurality of gate structures 300 matched with the plurality of channel structures 200. Each gate structure 300 comprises a gate dielectric layer 310 immediately adjacent to the plurality of channel structures 200 and a gate electrode layer 320 immediately adjacent to the gate dielectric layer 310.

Figure 7:
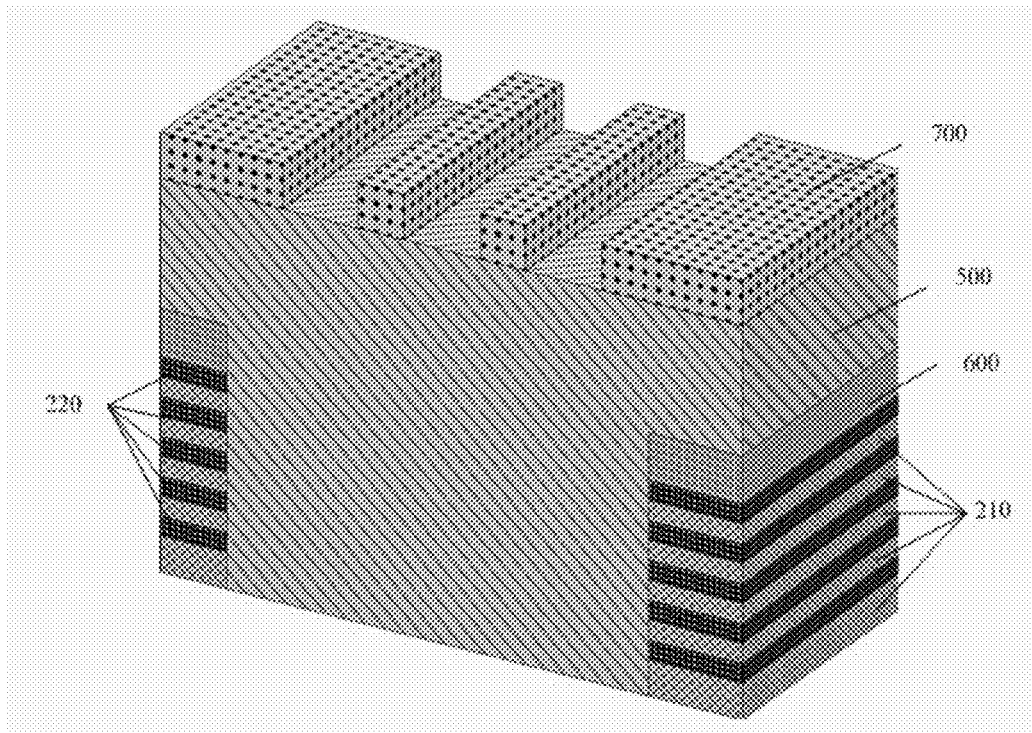

Specifically, firstly, as shown in FIG. 7, a patterned photoresist layer 700 is formed on the isolation layer 500.

Figure 8:
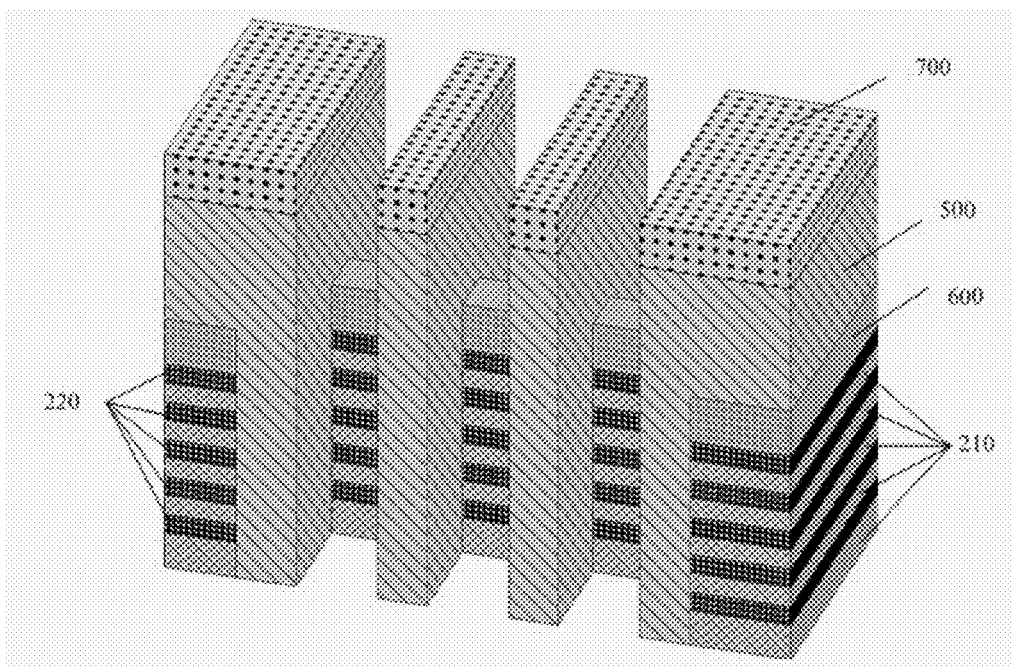

Secondly, as shown in FIG. 8, the isolation layer 500 is etched to remove parts of the isolation layer 500 uncovered by the photoresist layer 700 to form the plurality of gate windows. The plurality of channel structures 200 are retained because of a protection of the hard mask (i.e., the poly-Si layer 600). The plurality of single crystal semiconductor layers 210 and the plurality of single crystal oxide layers 220 are exposed.

Figure 9:
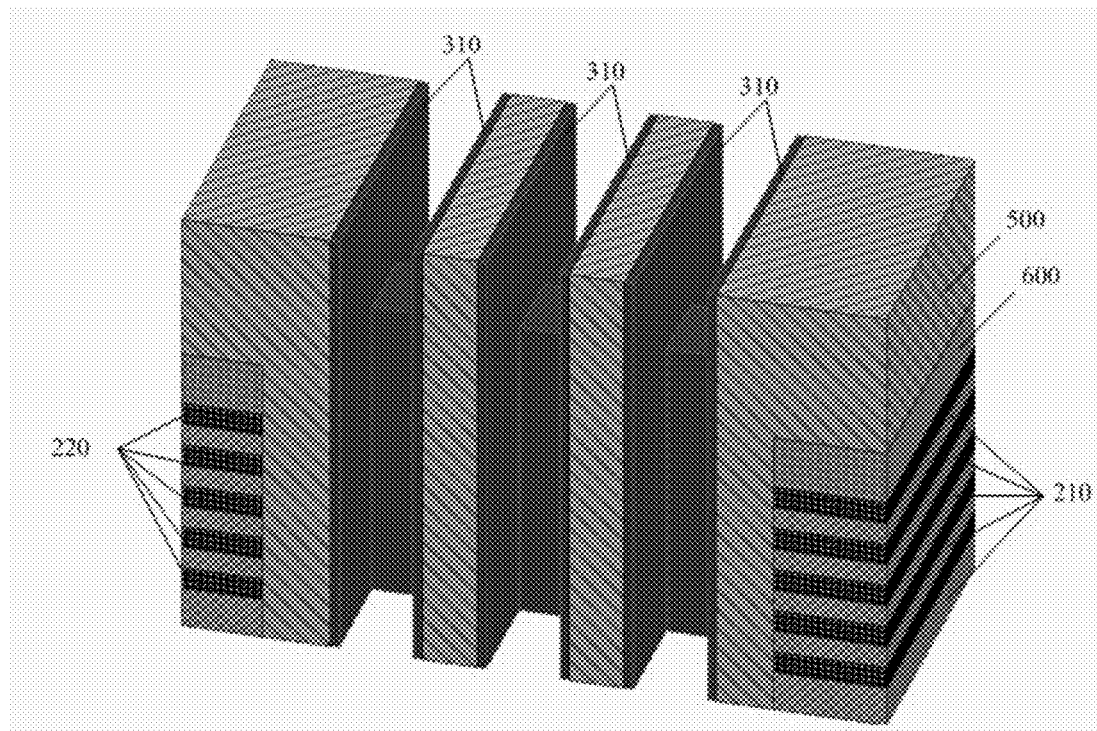

Thirdly, as shown in FIG. 9, a gate dielectric material is deposited in the plurality of gate windows to form the gate dielectric layer 310. The exposed single crystal semiconductor layers 210 and the exposed single crystal oxide layers 220 are covered by the gate dielectric layer 310.

In one embodiment, the gate dielectric layer 310 comprises a tunneling oxide layer, a charge trapping layer and a block oxide layer stacked sequentially. Specifically, the tunneling oxide layer is immediately adjacent to the channel structure, and a thickness of the tunneling oxide layer usually reaches a nanometer order of magnitude. Electrons excited by a certain voltage are allowed to go through the tunneling oxide layer and enter into the charge trapping layer to be trapped. Similarly, when excited by a certain voltage, electrons trapped by the charge trapping layer also may go through the tunneling oxide layer to be released. Therefore, the tunneling oxide layer is not only used for the purpose of insulation, but also used as a tunnel connected the charge trapping layer and the channel structure for exchanging charges. The charge trapping layer is usually made of a material with more defects and dislocations, by which the charges are trapped and thus difficult to lose in a short time. In this way, the charge trapping layer has a function of memory. The block oxide layer, which is formed between the charge trapping layer and the gate electrode layer 320, is used for blocking a charge passage between the charge trapping layer and the gate electrode layer 320. In one embodiment, a material of the charge trapping layer comprises any one of a nitride, a nano crystal, a poly-Si and a combination thereof. The three materials are generally poly crystal or amorphous, and thus have a higher interface state density and a larger defect density. Unsaturated bonds resulted from these interface states and defects may trap charges and retain the charges for a long time without exterior excitation. Moreover, the charges are trapped by spatially separated defects, which enables the memory structure to have a high anti-radiation capability.

Figure 10:
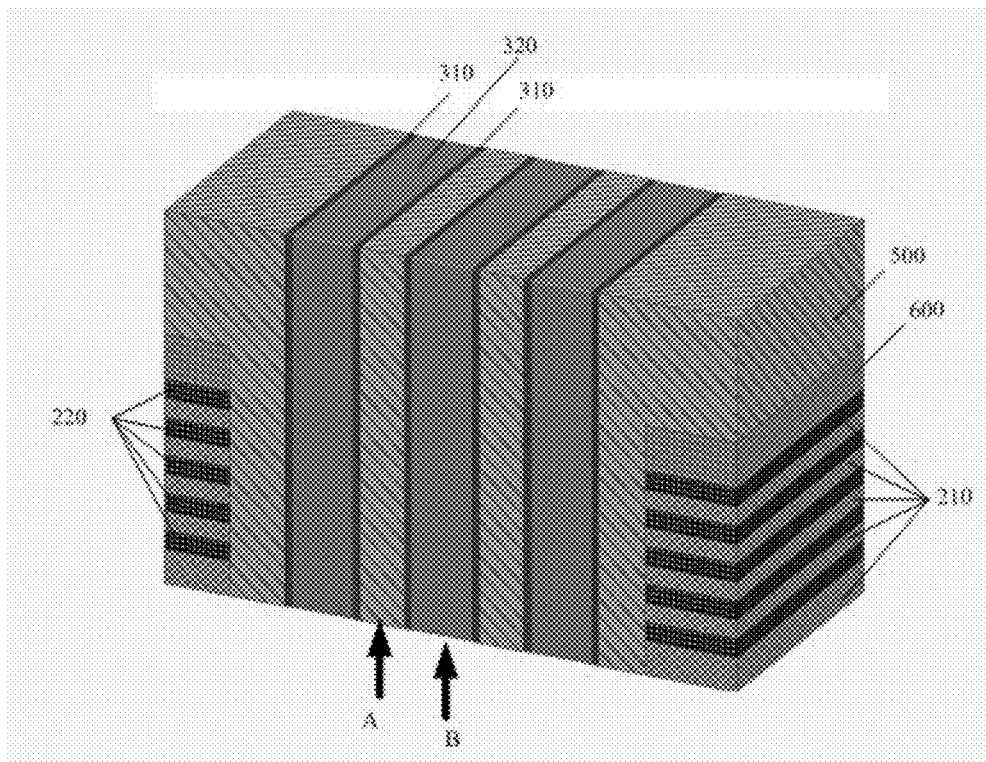
Figure 11A:
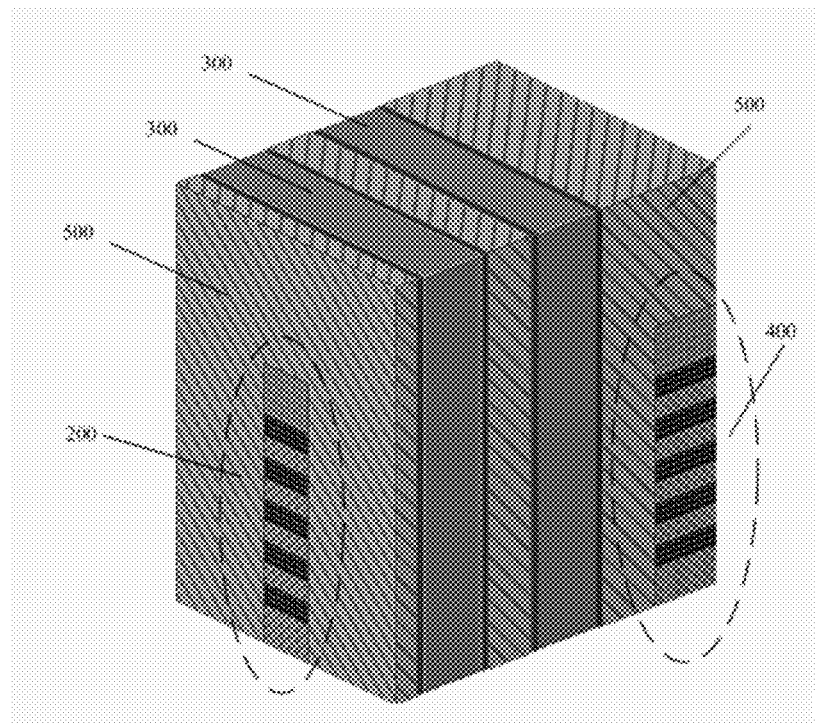
FIG. 11a is a schematic perspective view of the memory structure sectioned along an arrow A in FIG. 10.
Figure 11B:
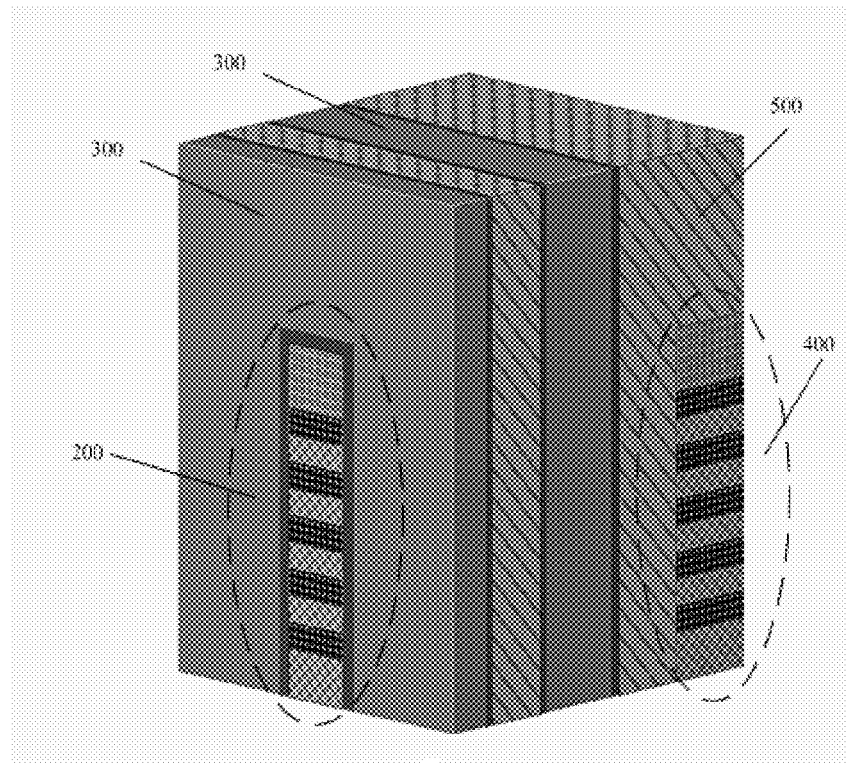
FIG. 11b is a schematic perspective view of the memory structure sectioned along an arrow B in FIG. 10.

Finally, as shown in FIG. 10, a gate electrode material is deposited in the plurality of gate windows and on the gate dielectric layer 310 to form the gate electrode layer 320. The gate dielectric layer 310 and the gate electrode layer 320 constitute the gate structure 300. Each channel structure 200 penetrates the plurality of gate structures 300, and each gate structure 300 covers the plurality of channel structures 200. It should be noted that, the plurality of gate structures 300 may be connected together. In this case, an etching may be further performed to form a plurality of separated gate structures. In order to help those skilled in the art to better understand the present disclosure, the memory structure in FIG. 10 is sectioned along an arrow A and an arrow B to obtain the memory structures in FIG. 11a and FIG. 11b respectively, in which the detailed structure of the channel structures 200 is better shown.

The memory structure and the method for forming the same according to embodiments of the present disclosure at least have following advantages.

(1) The process is simplified, and the yield is improved. The single crystal rare earth oxide or the single crystal beryllium oxide is used as an interlayer dielectric. Because among rare earth elements, most actinide elements are radioactive and hence are rarely applied, a lanthanide oxide is mostly used as the rare earth oxide. Both crystals of the rare earth oxide and a conventional semiconductor material such as Si, Ge, SiGe or GaAs belong to a cubic crystal system, and lattice constants of rare earth oxide crystals such as $La_2O_3$, $Pr_2O_3$, $Nd_2O_3$, $Er_2O_3$ or $Gd_2O_3$ of different lanthanide elements are approximately the same, which are about twice that of a Si or Ge crystal, that is, one unit cell of the rare earth oxide crystal is just matched with two unit cells of the Si or Ge crystal. Thus, lattice constants of the rare earth oxide crystal and the Si or Ge crystal are substantially matched with each other, which helps to form the single crystal semiconductor layer on the rare earth oxide layer and to form the rare earth oxide layer on the single crystal semiconductor layer. Similarly, both crystals of beryllium oxide and a conventional semiconductor material such as Si, Ge, SiGe or GaAs belong to a cubic crystal system, and a lattice constant of the beryllium oxide crystal is about half that of the Si crystal, that is, one unit cell of the Si crystal is just matched with two unit cells of the beryllium oxide crystal. Thus, the lattice constants of the Si crystal and the beryllium oxide crystal are substantially matched with each other, which may help to form the single crystal semiconductor layer on the single crystal beryllium oxide layer and to form the single crystal beryllium oxide layer on the single crystal semiconductor layer. Therefore, by using the lattice match between the rare earth oxide crystal or the beryllium oxide crystal and the conventional semiconductor crystal, the plurality of single crystal semiconductor layers and the plurality of oxide layers may be alternately formed by a simple process, such as an epitaxial growth, thus ensuring that the plurality of single crystal semiconductor layers are well isolated from each other. Moreover, a sacrifice layer is not required by the method, thus simplifying the process and improving the yield. Furthermore, a high-quality stack of the plurality of single crystal semiconductor layers and the plurality of oxide layers may be formed by simple alternate epitaxial growth, thus ensuring a growth quality and an amount of stacked layers.

(2) A lattice quality of the single crystal semiconductor layers is high, and a performance of a memory unit is improved. In one aspect, by adjusting the element type and content of the single crystal oxide layer, especially the element type and content of the rare earth oxide, the lattice constant thereof is adjusted accordingly. For instance, the lattice constant of $La_2O_3$ is slightly more than twice that of Ge, the lattice constants of $Er_2O_3$ and $Gd_2O_3$ are slightly smaller than twice that of Si, and the lattice constants of $Pr_2O_3$ and $Nd_2O_3$ are between twice those of Si and Ge. By adjusting the content of the element such as La or Er of the rare earth oxide, the lattice constant thereof may be matched with that of a semiconductor crystal such as Si, Ge, SiGe or GaAs so as to reduce a crystal defect and form the single crystal semiconductor layers with high quality, thus enabling a device formed subsequently with a high mobility and the memory unit with a better performance. In another aspect, since a single crystal SiGe sacrifice layer is not required, damages to the lattice of the single crystal semiconductor layers by the etching, refilling and floating are avoided, which not only reduces a performance degradation caused by the process to a largest extent, but also improves a reliability of the device. In addition, the memory unit in the VG NAND structure with a single crystal channel has advantages of good drive capability, smaller unit size, uniform threshold voltage and low off-state leakage current.

(3) An integration level of the memory unit is high. Provided that a time delay of the memory structure and a process level are fulfilled, the three-dimensional memory structure may be constructed with any number of stacked layers and with any number of arrays. Furthermore, with a reducing of the process difficulty, the number of the stacked layers and the number of the arrays will be increased, thus further increasing the integration level.

(4) A read-write speed is raised. The performance of the memory structure is improved because of high mobility of the memory unit, powerful drive capability, simple and reliable fabrication process, small process fluctuation, stable device parameter and flexible arrangement of bit lines and word lines.

(5) The heat conductivities of the single crystal rare earth oxide and the single crystal beryllium oxide are larger than that of a conventional oxide such as silicon dioxide or silicon oxynitride. For instance, the heat conductivity of the single crystal rare earth oxide is three times larger than that of the thermal growth $SiO_2$ dielectric, and the heat conductivity of the single crystal beryllium oxide is approximately equal to that of aluminium, thus improving the heat dissipation of devices significantly and enhancing a device performance accordingly.

(6) A conventional epitaxy process such as MOCVD (metal-organic chemical vapor deposition), SSE (solid source epitaxy), UHVCVD (ultra-high vacuum chemical vapor deposition) or MBE (molecular beam epitaxy) may be introduced to fabricate the channel structure. These fabrication processes are compatible with conventional semiconductor fabrication processes, simple to realize and low in cost.

Figure 12A:
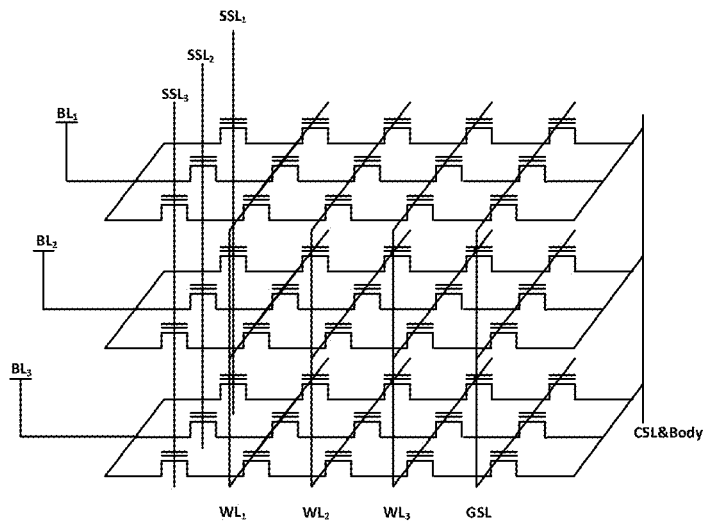
FIG. 12a is an equivalent circuit diagram of a 3D-NAND memory array based on the memory structure according to an embodiment of the present disclosure.

Furthermore, a 3D-NAND memory array based on the memory structure according to embodiments of the present disclosure is described below with reference to FIGS. 12a-12c. FIG. 12a is an equivalent circuit diagram of the 3D-NAND memory array, and FIG. 12b is a schematic perspective view of the 3D-NAND memory array.

Figure 12B:
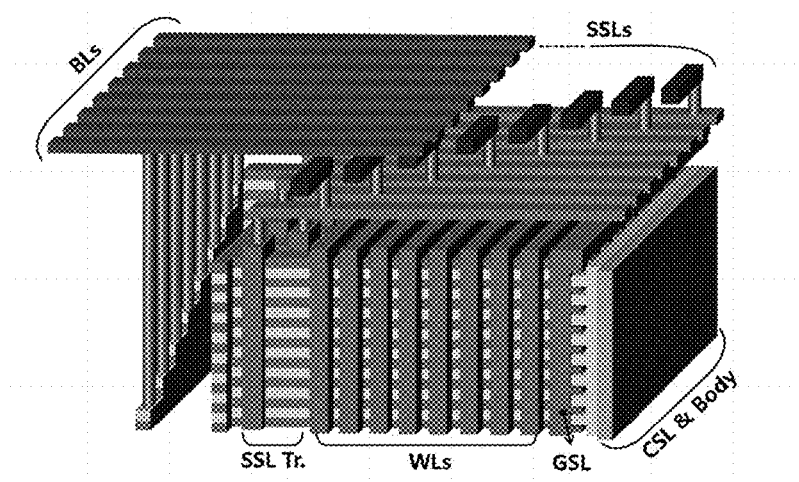

As shown in FIG. 12a and FIG. 12b, a gate electrode of the memory structure is a WL (Word Line), and a source and a drain of the memory structure are connected with a BL (Bit Line) and a CSL respectively. A control unit located on a periphery of the memory array comprises SSLs over the BLs and a GSL under the BLs. A selection transistor is disposed at each end of the memory array along each BL for controlling a connection or disconnection between each BL and a power supply or a ground. SSLs and the GSL are gate electrodes of these selection transistors respectively. In other words, there are two selection transistors located at both ends of one BL, i.e., both ends of one row of the memory array. A connecting relationship between the GSL and the BL are similar to that between the WL and the BL, and both the GSL and the BL control a connection or disconnection of each BL. However, each SSL is only connected with gate electrodes of the selection transistors of a part of BLs (usually one vertical column of the memory array) so as to only select the part of BLs. Since these selection transistors located on a periphery of the memory array have similar structure to that of the memory unit, they may be formed using the method for forming the memory structure according to embodiments of the present disclosure, except that there is a difference between etching windows for the gate structures of SSLs and etching windows for the gate structures of the memory structure.

Figure 12C:
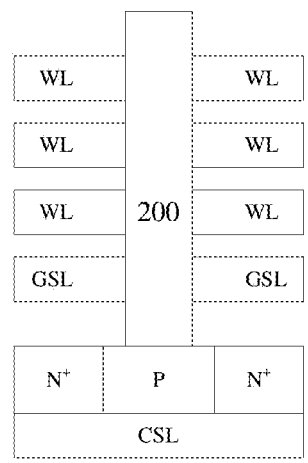

FIG. 12c is a schematic view showing a doping state of the GSL of the 3D-NAND memory array. The doping of the GSL may be realized by tilt angle implantation. An $N^+$ doped part of the GSL is used for providing the channel structure with enough electrons during a programming operation or a read operation, and a P doped part of the GSL is used for providing the channel structure with a low resistance passage during an erase operation.

For a 2D-NAND memory array, a unit is selected by using only the WL and the BL. However, for the 3D-NAND memory array, one column is selected by using the WL and the BL, and thus the SSL is required. An operation method of a memory unit of the 3D-NAND memory array is listed as follows.

|  | Programming | Read | Erase |
| --- | --- | --- | --- |
| Selected WL | $V_{pgm}$ | 0 V | 0 V |
| Unselected WL | $V_{pass}$ | $V_{read}$ | floating |
| Selected SSL | $V_{cc}$ | $V_{read}$ | floating |
| Unselected SSL | 0 V | 0 V | floating |
| Selected BL | 0 V | $V_{cc}$ | floating |
| Unselected BL | $V_{cc}$ | 0 V | floating |
| GSL | 0 V | $V_{cc}$ | floating |
| CSL&Body | 0 V | 0 V | $V_{ers}$ |

During the programming operation, a gate voltage, a source voltage and a drain voltage of the selected unit are: $V_{pgm}$, 0V, 0V. Provided that a programming voltage $V_{pgm}$ is high enough, hot electrons are implanted into a floating gate of the memory unit, thus executing the programming operation. Meanwhile, a gate voltage, a source voltage and a drain voltage of the unselected unit are retained in a range, where a hot electron implantation does not occur, so that the stored information will not be changed.

During the read operation, $V_{read}$ is applied to the SSL of the selected unit, $V_{cc}$ is applied to the selected BL and GSL, the voltage of the WL of the selected unit is set to 0V, and $V_{read}$ is applied to the WLs of other unselected units. $V_{read}$ applied to the SSL of the selected unit is high enough to enable each memory unit on the bit line to be turned on, without changing information stored in the floating gate. The stored information may be read by judging whether the selected unit is on.

During the erase operation, electrons stored in the floating gate are extracted because of a tunneling effect by applying a high enough reverse voltage between the gate electrode and the drain of the selected unit and between the gate electrode and the source of the selected unit, thus executing the erase operation.

Reference throughout this specification to "an embodiment", "some embodiments", "one embodiment", "an example", "a specific example", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "in an example", "in a specific example", or "in some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A memory structure, comprising:
a substrate;
a plurality of channel structures formed on the substrate, wherein the plurality of channel structures are parallel with each other, each channel structure comprises a plurality of single crystal semiconductor layers and a plurality of oxide layers alternately stacked in a direction perpendicular to the substrate, and at least one of the plurality of oxide layers is a single crystal oxide layer, the single crystal oxide layer comprising one or more single crystal oxide sub-layers, and/or each single crystal semiconductor layer comprising one or more single crystal semiconductor sub-layers; and a plurality of gate structures matched with the plurality of channel structures, wherein each gate structure comprises a gate dielectric layer immediately adjacent to the plurality of channel structures and a gate electrode layer immediately adjacent to the gate dielectric layer.

2. The memory structure according to claim 1, wherein a material of the single crystal oxide layer comprises any one of BeO, a rare earth oxide and a combination thereof; and the rare earth oxide comprises any one of $(Gd_{1-x}Er_x)_2O_3$, $(Gd_{1-x}Nd_2)_2O_3$, $(Er_{1-x}Nd_2)_2O_3$, $(Pr_{1-x}La_x)_2O_3$, $(Pr_{1-x}Nd_x)_2O_3$, $(Pr_{1-x}Gd_x)_2O_3$, $(Er_{1-x}La_x)_2O_3$ and a combination thereof, where x is within a range from 0 to 1.

3. The memory structure according to claim 1, wherein the plurality of gate structures are perpendicular to the plurality of channel structures, each channel structure penetrates the plurality of gate structures, and each gate structure covers the plurality of channel structures.

4. The memory structure according to claim 1, further comprising:
a first isolation structure formed between adjacent gate structures.

5. The memory structure according to claim 1, further comprising:
two semiconductor structures formed at both ends of the plurality of channel structures.

6. The memory structure according to claim 5, further comprising:
a second isolation structure formed between the gate structure and the semiconductor structure.

7. The memory structure according to claim 1, further comprising:
a poly-Si layer formed on the plurality of channel structures.

8. The memory structure according to claim 1, wherein each single crystal semiconductor layer is an extrinsic semiconductor layer; each gate dielectric layer comprises a tunneling oxide layer, a charge trapping layer and a block oxide layer stacked sequentially; a material of the charge trapping layer comprises any one of a nitride, a nano crystal, a poly-Si and a combination thereof; and a material of each single crystal semiconductor layer comprises any one of Si, Ge, SiGe, group III-V compound semiconductor materials, group II-VI compound semiconductor materials and a combination thereof.

9. The memory structure according to claim 1, wherein a thickness of the single crystal oxide layer is not less than 25 nm.

10. The memory structure according to claim 1, wherein a material of the substrate comprises single crystal Si, single crystal SiGe and single crystal Ge.

11. A method for forming a memory structure, comprising:
providing a substrate;
forming a plurality of single crystal semiconductor layers and a plurality of oxide layers alternately stacked on the substrate in a direction perpendicular to the substrate, wherein at least one of the plurality of oxide layers is a single crystal oxide layer, the single crystal oxide layer comprising one or more single crystal oxide sub-layers, and/or each single crystal semiconductor layer comprising one or more single crystal semiconductor sub-layers;
etching the plurality of single crystal semiconductor layers and the plurality of oxide layers to form a plurality of channel structures parallel with each other; and
forming a plurality of gate structures matched with the plurality of channel structures on the substrate, wherein each gate structure comprises a gate dielectric layer immediately adjacent to the plurality of channel structures and a gate electrode layer immediately adjacent to the gate dielectric layer.

12. The method according to claim 11, further comprising:
after forming the plurality of gate structures matched with the plurality of channel structures on the substrate, forming a first isolation structure between adjacent gate structures and on the plurality of channel structures; or
before forming the plurality of gate structures matched with the plurality of channel structures on the substrate, forming an isolation layer covering the plurality of channel structures on the substrate, and etching the isolation layer to form a plurality of gate windows, where the plurality of gate structures are to be formed.

13. The method according to claim 12, wherein a material of the single crystal oxide layer comprises any one of BeO, a rare earth oxide and a combination thereof; and the rare earth oxide comprises any one of $(Gd_{1-x}Er_x)_2O_3$, $(Gd_{1-x}Nd_x)_2O_3$, $(Er_{1-x}Nd_x)_2O_3$, $(Pr_{1-x}La_x)_2O_3$, $(Pr_{1-x}Nd_x)_2O_3$, $(Pr_{1-x}Gd_x)_2O_3$, $(Er_{1-x}La_x)_2O_3$ and a combination thereof, where x is within a range from 0 to 1.

14. The method according to claim 11, wherein the plurality of gate structures are perpendicular to the plurality of channel structures, each channel structure penetrates the plurality of gate structures, and each gate structure covers the plurality of channel structures.

15. The method according to claim 11, further comprising:
etching the plurality of single crystal semiconductor layers and the plurality of oxide layers to simultaneously form the plurality of channel structures and two semiconductor structures formed at both ends of the plurality of channel structures.

16. The method according to claim 11, further comprising:
forming a poly-Si layer on the plurality of channel structures.

17. The method according to claim 11, wherein each single crystal semiconductor layer is an extrinsic semiconductor layer; each gate dielectric layer comprises a tunneling oxide layer, a charge trapping layer and a block oxide layer stacked sequentially; a material of the charge trapping layer comprises any one of a nitride, a nano crystal, a poly-Si and a combination thereof; and a material of each single crystal semiconductor layer comprises any one of Si, Ge, SiGe, group III-V compound semiconductor materials, group II-VI compound semiconductor materials and a combination thereof.

18. The method according to claim 11, wherein a thickness of the single crystal oxide layer is not less than 25 nm; and a material of the substrate comprises single crystal Si, single crystal SiGe and single crystal Ge.

* * * * *